(12) United States Patent
Lee et al.

(10) Patent No.: US 9,097,771 B2
(45) Date of Patent: *Aug. 4, 2015

(54) VOLTAGE SENSING ASSEMBLY AND BATTERY MODULE INCLUDING THE SAME

(71) Applicant: LG CHEM, LTD., Seoul (KR)

(72) Inventors: BumHyun Lee, Seoul (KR); Jong Moon Yoon, Daejeon (KR); JaeHun Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 51 days.

This patent is subject to a terminal disclaimer.

(21) Appl. No.: 13/969,843

(22) Filed: Aug. 19, 2013

(65) Prior Publication Data
US 2013/0330584 A1 Dec. 12, 2013

Related U.S. Application Data

(63) Continuation of application No. PCT/KR2012/003145, filed on Apr. 24, 2012.

(30) Foreign Application Priority Data

May 13, 2011 (KR) .................. 10-2011-0045010

(51) Int. Cl.
*H01M 10/48* (2006.01)
*G01R 31/36* (2006.01)
(Continued)

(52) U.S. Cl.
CPC .......... *G01R 31/3627* (2013.01); *H01M 2/1077* (2013.01); *H01M 10/482* (2013.01);
(Continued)

(58) Field of Classification Search
CPC .................... H01M 10/482; H01M 10/425
USPC ...................................... 429/90, 91
See application file for complete search history.

(56) References Cited

U.S. PATENT DOCUMENTS

| 8,802,259 B2 * | 8/2014 | Lee et al. ............. 429/90 |
| 2006/0170394 A1 | 8/2006 | Ha et al. |
| 2009/0325043 A1 | 12/2009 | Yoon et al. |
| 2012/0015550 A1 * | 1/2012 | Ikeda et al. ............ 439/391 |
| 2013/0101883 A1 * | 4/2013 | Zhao ..................... 429/121 |

FOREIGN PATENT DOCUMENTS

| CN | 101395490 A | 3/2009 |
| CN | 101395737 A | 3/2009 |

(Continued)

OTHER PUBLICATIONS

International Search Report issued in PCT/KR2012/003145, mailed on Nov. 14, 2012.

*Primary Examiner* — Patrick Ryan
*Assistant Examiner* — Lucas J O'Donnell
(74) *Attorney, Agent, or Firm* — Birch, Stewart, Kolasch & Birch, LLP (57) ABSTRACT

Disclosed is a voltage sensing assembly for sensing voltage of battery cells, each having electrode terminals formed at an upper or lower end thereof, in a state in which the voltage sensing assembly is mounted to a battery module, the voltage sensing assembly including (a) a block case formed of an electrically insulating material, the block case being mounted, horizontally within a space between electrode terminal connection parts of the battery cells, to the front or rear of the battery module, (b) wires connected respectively to voltage sensing terminals, each of the voltage sensing terminals being integrally formed at an upper or lower end of a corresponding one of bus bars electrically connected to the electrode terminal connection parts of the battery cells, and (c) a connector that transmits detected voltages of the wires to a controller.

21 Claims, 10 Drawing Sheets

(51) Int. Cl.
*H01M 2/10* (2006.01)
*H01M 10/613* (2014.01)
*H01M 10/6555* (2014.01)
*H01M 2/02* (2006.01)
*B60L 11/18* (2006.01)
*H01M 10/42* (2006.01)

(52) U.S. Cl.
CPC ...... *H01M10/5004* (2013.01); *H01M 10/5055* (2013.01); *H01M 10/613* (2013.01); *H01M 10/6555* (2013.01); *B60L 11/1879* (2013.01); *H01M 2/0275* (2013.01); *H01M 2/0277* (2013.01); *H01M 2/0285* (2013.01); *H01M 2/0287* (2013.01); *H01M 10/425* (2013.01); *H01M 2220/20* (2013.01); *Y02T 10/705* (2013.01); *Y02T 10/7005* (2013.01)

(56) References Cited

FOREIGN PATENT DOCUMENTS

| | | |
|---|---|---|
| EP | 2 315 297 A1 | 4/2011 |
| JP | 2010-170884 A | 8/2010 |
| JP | 2011-040332 A | 2/2011 |
| JP | 2011-065749 A | 3/2011 |
| JP | 2011-077031 A | 4/2011 |
| JP | 2011-526729 A | 10/2011 |
| KR | 10-2006-0116678 A | 11/2006 |
| KR | 10-2007-0110565 A | 11/2007 |
| KR | 10-2008-0038467 A | 5/2008 |
| KR | 10-2010-0081942 A | 7/2010 |
| WO | WO 2010/002144 A2 | 1/2010 |
| WO | WO 2010/002144 A9 | 1/2010 |
| WO | WO 2011021614 A1 * | 2/2011 |
| WO | WO 2011/027917 A1 | 3/2011 |

* cited by examiner

VOLTAGE SENSING ASSEMBLY AND BATTERY MODULE INCLUDING THE SAME

CROSS REFERENCE TO RELATED APPLICATIONS

This application is a Bypass Continuation of PCT International Application No. PCT/KR2012/003145 filed on Apr. 24, 2012, which claims priority under 35 U.S.C §119(a) to Patent Application No. 10-2011-0045010 filed in the Republic of Korea on May 13, 2011, all of which are hereby expressly incorporated by reference into the present application.

TECHNICAL FIELD

The present invention relates to a voltage sensing assembly for sensing voltage of battery cells, each having electrode terminals formed at an upper or lower end thereof, in a state in which the voltage sensing assembly is mounted to a battery module, the voltage sensing assembly including a block case, which is formed of an electrically insulating material and is mounted, horizontally within a space between electrode terminal connection parts of the battery cells, to the front or rear of the battery module, wires connected respectively to voltage sensing terminals, each of the voltage sensing terminals being integrally formed at an upper or lower end of a corresponding one of bus bars, and a connector that transmits detected voltages of the wires to a controller, wherein the block case includes a fastening member that protrudes forward from the block case to securely fix the wires, and the wires are connected to the voltage sensing terminals of the bus bars in a state in which the wires are mounted to the fastening member of the block case.

BACKGROUND ART

Recently, secondary batteries, which can be charged and discharged, have been widely used as energy sources for wireless mobile devices. Secondary batteries have also attracted considerable attention as power sources for electric vehicles (EV), hybrid electric vehicles (HEV) and plug-in hybrid electric vehicles (plug-in HEV), which have been developed to solve problems, such as air pollution, caused by existing gasoline and diesel vehicles that use fossil fuels.

Small-sized mobile devices use one or several battery cells for each device. On the other hand, middle or large-sized devices such as vehicles use a battery module including a number of battery cells electrically connected to each other because high power and large capacity are necessary for the middle or large-sized devices.

Since the battery module is preferably manufactured to have as small a size and weight as possible, prismatic batteries or pouch-shaped batteries, which can be stacked with high integration and have a small weight to capacity ratio, are usually used as battery cells of middle or large-sized battery modules. In particular, much interest is currently focused on pouch-shaped batteries, which use an aluminum laminate sheet as a sheathing member, due to their advantages of being lightweight and cheap to manufacture.

In addition, since the battery module is made up by combining a number of battery cells, safety and operating efficiency of the battery module are considerably deteriorated when some of the battery cells suffer from overvoltage, overcurrent or overheat. Therefore, it is necessary to provide a means for sensing and controlling such overvoltage, overcurrent or overheat. Thus, voltage sensors or the like are connected to the battery cells to check and control operating states of the battery cells in real time or at predetermined intervals. However, installation or connection of such measuring members greatly complicates the process of assembling the battery module and may cause a short circuit due to use of many wires. Further, as the secondary battery is used as a power source for vehicles as a result of extension of the application range of the secondary battery, there is a need to provide a fastening means to maintain the sensing means in a stable contact state even when strong impact or vibration is applied to the battery module.

In addition, when a battery module is constructed using a plurality of battery cells or is constructed using a plurality of cell modules, each including a specific number of battery cells, it is generally necessary to provide a large number of members for mechanical coupling and electrical connection between the battery cells or the unit modules and therefore the process of assembling such members is very complicated.

Furthermore, spaces for coupling, welding, or soldering of the members are needed to achieve such mechanical coupling and electrical connection, thereby increasing overall battery system size. Such size increase is undesirable as previously described.

In addition, when additional assembly parts such as receptacle terminals are used, there is a problem in that correct voltage sensing is not easy due to contact resistance at contact portions of the assembly parts.

Thus, there is a great need to provide a voltage sensing assembly, which is more compact and exhibits improved voltage sensing reliability while fundamentally solving the above problems, and a battery module including the same.

DISCLOSURE

Technical Problem

Therefore, the present invention has been made to solve the above and other technical problems that have yet to be resolved.

Specifically, it is an object of the present invention to provide a voltage sensing assembly structured such that wires are directly assembled on bus bars without using additional assembly structures such as connection structures between bus bars and receptacle terminals to achieve a reliable sensing structure.

It is another object to provide a voltage sensing assembly that can be manufactured through a simple assembly method without using a number of members for mechanical coupling and electrical connection.

It is another object to provide a voltage sensing assembly that is formed as a separate assembly to improve productivity and maintenance of battery modules.

Technical Solution

In accordance with the present invention, the above and other objects can be accomplished by the provision of a voltage sensing assembly for sensing voltage of battery cells, each having electrode terminals formed at an upper or lower end thereof, in a state in which the voltage sensing assembly is mounted to a battery module, the voltage sensing assembly including (a) a block case formed of an electrically insulating material, the block case being mounted, horizontally within a space between electrode terminal connection parts of the battery cells, to the front or rear of the battery module, (b) wires connected respectively to voltage sensing terminals, each of the voltage sensing terminals being integrally formed at an upper or lower end of a corresponding one of bus bars electrically connected to the electrode terminal connection parts of the battery cells, and (c) a connector that transmits detected voltages of the wires to a controller, wherein the block case includes a fastening member that protrudes forward from the block case to securely fix the wires, and the wires are connected to the voltage sensing terminals of the bus bars in a state in which the wires are mounted to the fastening member of the block case.

In the voltage sensing assembly according to the present invention, the wires are connected to the voltage sensing terminals of the bus bars in a state in which the wires are mounted to the fastening member of the block case. Therefore, the voltage sensing assembly has a compact structure to reliably measure voltage and the overall assembly process thereof is simple.

In addition, it is possible to reduce the number of parts, decreasing production costs, since the wires are connected to the voltage sensing terminals of the bus bars without additional assembly parts such as receptacle terminals and it is possible to improve the reliability of voltage sensing since there is no contact resistance of the assembly parts.

Further, the voltage sensing assembly can easily be mounted to the front or rear of the battery module since the voltage sensing assembly for sensing voltage of battery cells has a single modular assembly structure.

Furthermore, the assembly structure of the voltage sensing assembly, which is configured as a separate unit, allows manufacture of the voltage sensing assembly to be outsourced, thereby greatly improving productivity of battery modules. When parts of the voltage sensing assembly malfunction, the voltage sensing assembly mounted to the front or rear of the battery module can be replaced without disassembly of the battery module, thereby greatly improving maintenance as compared with the conventional battery module structure.

For example, the controller may be a Battery Management System (BMS).

Preferably, the block case is provided at upper and lower ends thereof with openings at positions corresponding to the voltage sensing terminals of the bus bars such that the voltage sensing terminals are inserted into the openings. This makes it possible to prevent the voltage sensing terminals from protruding from the front of the block case.

Although the structure of the voltage sensing terminals is not particularly limited so long as the voltage sensing terminals are easily coupled to wires, each of the voltage sensing terminals may have, for example, a clamping structure into which a wire is inserted. This makes it possible to easily achieve coupling between the wires and the voltage sensing terminals through simple manipulation.

Preferably, each of the wires is wrapped with an insulating tape or is mounted in a tubular insulating member to achieve insulation from the outside. The tubular insulating member may be, for example, a hollow insulating pipe.

Although the shape of the fastening member is not particularly limited so long as wires are easily mounted to the fastening member, the fastening member may be, for example, clamp-shaped. This makes it possible to easily mount wires and to prevent the mounted wires from being dislocated.

In a preferred example, each of the bus bars may include a plate-shaped body, which is bent perpendicularly at opposite lateral ends thereof such that the plate-shaped body is electrically connected to electrode terminal connection parts of corresponding battery cells, and a voltage sensing terminal formed at an upper or lower end of the plate-shaped body.

In a specific example, one of the bus bars, which is connected to a cathode or anode external input and output terminal, may further include an external input and output terminal connection part that extends diagonally downward from one side of a lower end of a plate-shaped body of the one bus bar.

In this structure, the external input and output terminal connection part is provided with a fastening hole into which the external input and output terminal can be coupled. Thus, the external input and output terminal is inserted into the fastening hole of the external input and output terminal connection part to achieve electrical connection of the bus bar with the external input and output terminal.

In a preferred example, a voltage sensing terminal of one of the bus bars connected to a cathode or anode external input and output terminal may be formed at a lower end of the one bus bar, the lower end being perpendicularly bent forward of the battery module.

Preferably, partition walls for preventing current passage through moisture are formed on upper and lower end surfaces of the block case. This prevents current passage through moisture.

The present invention provides a battery module including the voltage sensing assembly.

In a preferred example, the battery module includes a unit module stack in which two or more unit modules are arranged side by side, each of the unit modules being structured such that one or more battery cells housed within a cell cover are mounted in a cartridge, and cover members attached to four corners of the unit module stack.

In a preferred example, each of the cartridges has a rectangular structure corresponding to a battery cell such that the battery cell can be mounted in the cartridge and is provided at a central region thereof with a through hole for heat dissipation, fastening holes, through which fastening members to fix the unit module stack are inserted, are formed in four corners of each of the cartridges, and a coupling part, to which an insulative mounting member for mounting the voltage sensing assembly and bus bars is fastened in an assembly fashion such that the voltage sensing assembly is securely connected to the bus bars, is formed at the front of each of the cartridges.

For example, the bus bars may be thermally welded to an injection molded material of the insulative mounting member.

The insulative mounting member may have a rectangular parallelepiped structure having a size corresponding to the front of the unit module stack and may be provided at the rear thereof with cartridge coupling grooves, into which front ends of the cartridges can be inserted and coupled, and at opposite sides of the front thereof with electrode terminal through holes, through which electrode terminal connection parts of the battery cells are introduced from the rear of the insulative mounting member such that the electrode terminal connection parts are exposed.

In an example, the insulative mounting member may be provided at opposite ends of the front thereof with external input and output terminal connection part location parts to securely mount external input and output terminal connection parts of the bus bars to the insulative mounting member, at a central region of the front thereof with a block case location part to securely mount the block case to the insulative mounting member, and on the front thereof with bus bar location parts, each having a size corresponding to each of the bus bars, to mount the bus bars to the insulative mounting member.

A fastening protrusion may be formed on each of the external input and output terminal connection part location parts. Thus, the fastening protrusion can easily be inserted into a corresponding one of the external input and output terminal connection parts of the bus bars.

The electrode terminal connection parts of the battery cells, which are exposed forward through the electrode terminal through holes, may be electrically connected to opposite lateral sides of the bus bars, the opposite lateral sides being mounted in the electrode terminal through holes.

Preferably, the bus bars are coupled to the bus bar location parts through thermal welding. Thus, the bus bars and the insulative mounting member may be integrally formed.

Partition walls may be formed on upper and lower end surfaces of the insulative mounting member to prevent current passage through moisture.

Each of the battery cells may be a pouch-shaped battery cell including an electrode assembly mounted in a case formed of a laminate sheet including a resin layer and a metal layer.

The battery module according to the present invention generally has an overall compact structure and can achieve structurally stable mechanical fastening and electrical connection without using a large number of members. A predetermined number, such as 4, 6, 8, or 10, of battery cells or cell modules may constitute a battery module and therefore it is possible to effectively mount a necessary number of battery modules in a limited space.

The present invention also provides a high-power, large-capacity battery pack manufactured using the battery module as a unit body.

The battery pack according to the present invention may be manufactured by combining battery modules based on desired power and capacity. In consideration of installation efficiency and structural stability as previously described, the battery pack according to the present invention is preferably used as a power source for electric vehicles, hybrid electric vehicles, plug-in hybrid electric vehicles, or power storage devices.

The present invention also provides a voltage sensing assembly having a different structure.

Specifically, the present invention provides a voltage sensing assembly for sensing voltage of battery cells, each having electrode terminals formed at an upper or lower end thereof, in a state in which the voltage sensing assembly is mounted to a battery module, the voltage sensing assembly including (a) bus bars electrically connected to electrode terminal connection parts of the battery cells, (b) wires connected respectively to voltage sensing terminals, each of the voltage sensing terminals being integrally formed at an upper or lower end of a corresponding one of the bus bars, and (c) a connector that transmits detected voltages of the wires to a controller, wherein each of the voltage sensing terminals has a clamping structure into which a wire is inserted.

In the voltage sensing assembly, each of the voltage sensing terminals has a clamping structure to which a wire can be fastened and is integrally formed at an upper or lower end of a corresponding one of the bus bars. Therefore, it is possible to reliably sense voltage of the battery module without additional receptacle terminals.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, embodiments of the present invention will be described in detail with reference to the accompanying drawings. However, it should be noted that the description of the embodiments is given to provide better understanding of the present invention without limiting the scope of the invention.

Figure 1:
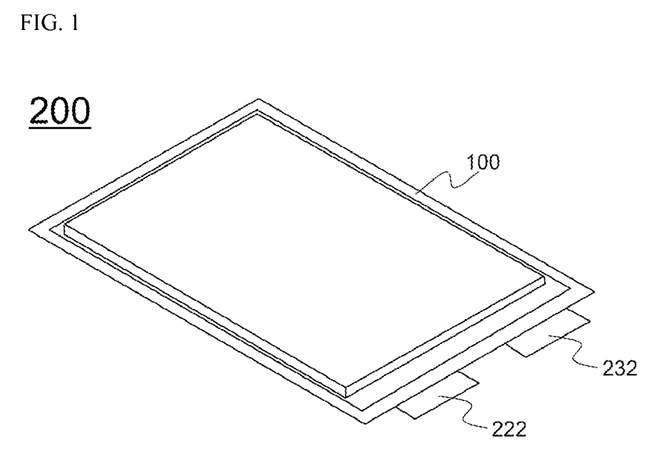
FIG. 1 is a schematic perspective view of a battery cell mounted in a unit module.
Figure 2:
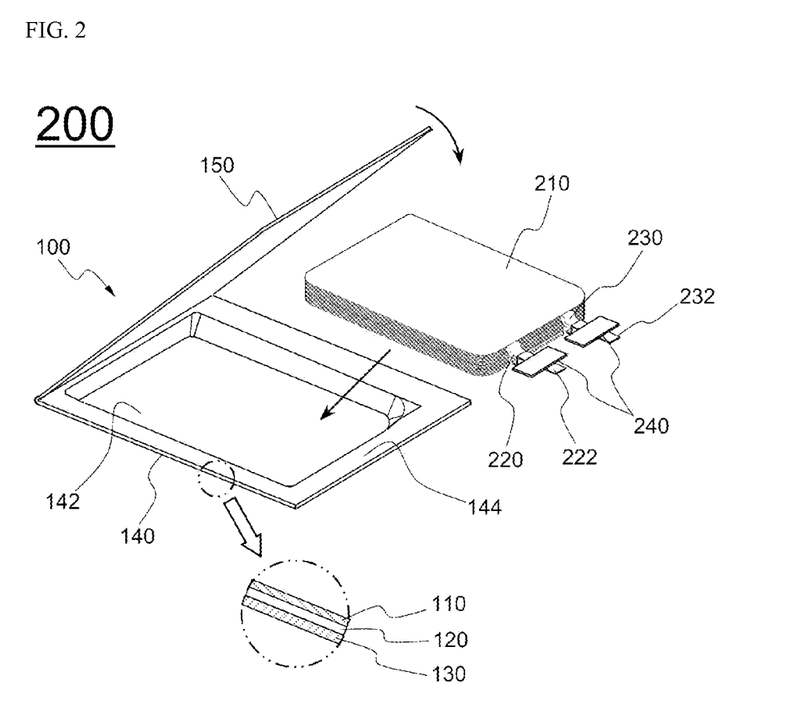
FIG. 2 is a schematic exploded view of FIG. 1.

FIG. 1 is a schematic perspective view of an exemplary battery cell mounted in a unit module according to the present invention, and FIG. 2 is a schematic exploded view of FIG. 1.

As shown in FIGS. 1 and 2, a pouch-shaped battery cell 200 has a structure in which an electrode assembly 210, including cathodes, anodes and separators disposed between the cathodes and the anodes, is sealed in a pouch-shaped battery case 100 such that two electrode terminals 222 and 232 electrically connected to cathode and anode tabs 220 and 230 of the electrode assembly are exposed to the outside.

The battery case 100 includes a case body 140 having a recessed receiving part 142, in which the electrode assembly 210 can be placed, and a cover 150 integrally connected to the case body 140.

The cathode tabs 220 and the anode tabs 230 of the electrode assembly 210, which has a stacked structure or a stacked/folded structure, are coupled respectively to the electrode terminal 222 and the electrode terminal 232 by welding. Here, the electrode assembly 210 may also have a structure, such as a folded structure, rather than the stacked or stacked/folded structure.

Insulating films 240 are also attached to the top and bottom of each of the electrode terminals 222 and 232 to prevent the occurrence of a short circuit between a thermal welder and the electrode terminals 222 and 232 and to achieve sealing between the electrode terminals 222 and 232 and the battery case 100 when a surplus part 144 of the case body 140 and the cover 150 are thermally welded to each other using the thermal welder.

Each of the case body 140 and the cover 150 includes an outer resin layer 110, an isolation metal layer 120, and an inner resin layer 130. The inner resin layers 130 of the case body 140 and the cover 150 may be tightly fixed to the each other by heat and pressure that the thermal welder (not shown) applies to the outer surfaces of the case body 140 and the cover 150.

In a state in which the electrode assembly 210 impregnated with an electrolyte is placed in the receiving part 142, contact parts between the surplus part 144 of the case body 140 and the cover 150 are thermally welded to form sealed parts.

Figure 3:
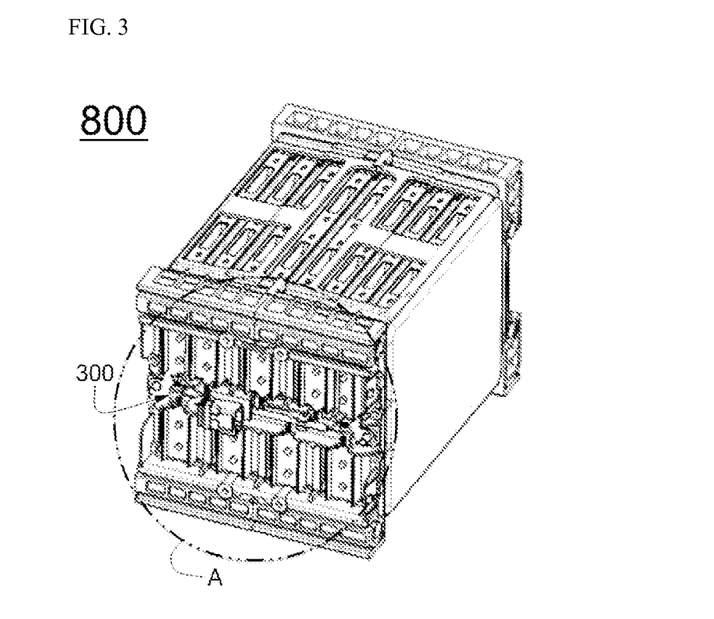
FIG. 3 is a perspective view of a battery module to which a voltage sensing assembly according to an embodiment of the present invention is mounted.
Figure 4:
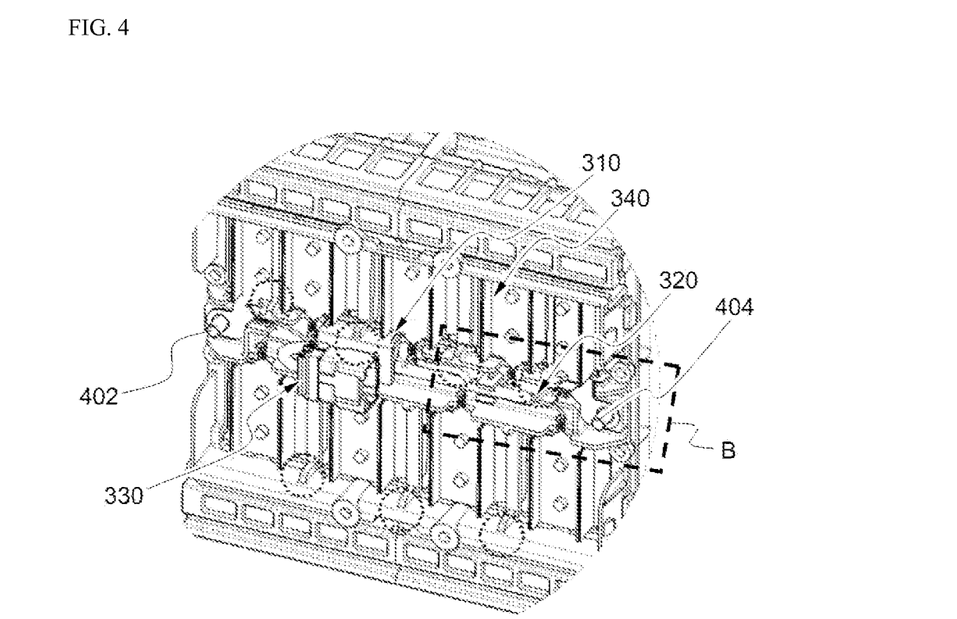
FIG. 4 is a magnified perspective view of a part A of the battery module of FIG. 3.
Figure 5:
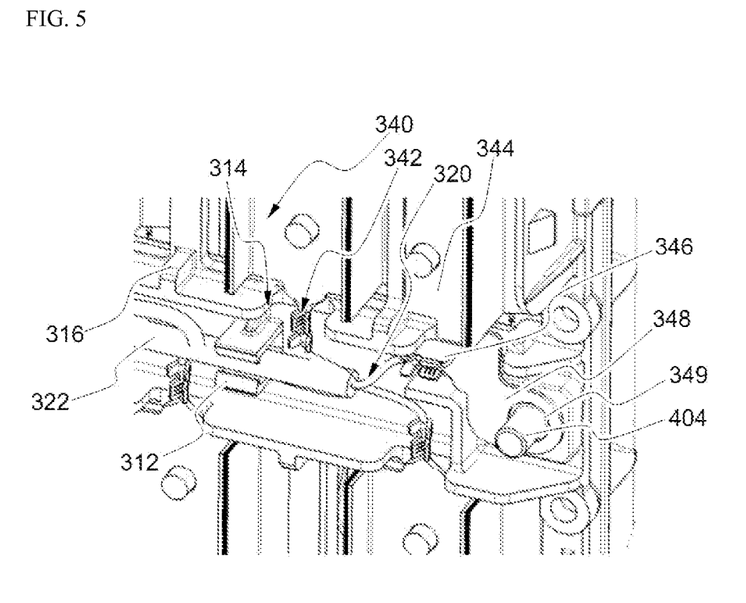
FIG. 5 is a magnified perspective view of a part B of FIG. 4.

FIG. 3 is a schematic perspective view of a battery module to which a voltage sensing assembly according to an embodiment of the present invention is mounted, FIG. 4 is a schematic magnified perspective view of a part A of the battery module of FIG. 3, and FIG. 5 is a schematic magnified perspective view of a part B of FIG. 4.

As shown in these drawings, a voltage sensing assembly 300 includes a block case 310 formed of an electrically insulating material, wires 320 connected respectively to voltage sensing terminals, and a connector 330 that transmits detected voltages of the wires 320 to a controller (not shown).

The block case 310 is mounted, horizontally within a space between electrode terminal connection parts of battery cells, to the front of the battery module 800. Voltage sensing terminals 342 and 346 are formed at upper or lower ends of bus bars 340 electrically connected to the electrode terminal connection parts of the battery cells.

A clamp-shaped fastening member 312 protrudes forward from the block case 310 to securely fix the wires 320. The wires 320 are connected to the voltage sensing terminals 346 of the bus bars 340 in a state in which the wires 320 are mounted to the fastening member 312 of the block case 310.

The block case 310 is provided at upper and lower ends thereof with openings 314 at positions corresponding to the voltage sensing terminals 342 of the bus bars 340 such that the voltage sensing terminals 342 are inserted into the openings 314. Each of the voltage sensing terminals 342 has a clamping structure into which a wire 320 is inserted.

The wires 320 are mounted in a plate-shaped insulating member 322 to achieve insulation from the outside. Each of the bus bars 340 includes a plate-shaped body 344 and a voltage sensing terminal 342.

The plate-shaped body 344 is bent perpendicularly at opposite lateral ends thereof such that the plate-shaped body 344 is electrically connected to electrode terminal connection parts of corresponding battery cells. The voltage sensing terminal 342 is integrally formed at an upper or lower end of the plate-shaped body 344.

A bus bar, which is connected to each of a cathode external input and output terminal 402 and an anode external input and output terminal 404, includes an external input and output terminal connection part 348 which extends diagonally downward from one side of the lower end of a plate-shaped body 344 of the bus bar.

The external input and output terminal connection part 348 has a fastening hole 349 such that the external input and output terminal 404 is inserted into the fastening hole 349 to achieve electrical connection between the bus bar and the external input and output terminal 404.

Voltage sensing terminals 346 of the bus bars connected to the cathode external input and output terminal 402 and the anode external input and output terminal 404 are formed at lower ends of the bus bars which are perpendicularly bent forward of the battery module 800. Partition walls 316 are formed at upper and lower end surfaces of the block case 310 to prevent current passage through moisture.

Figure 6:
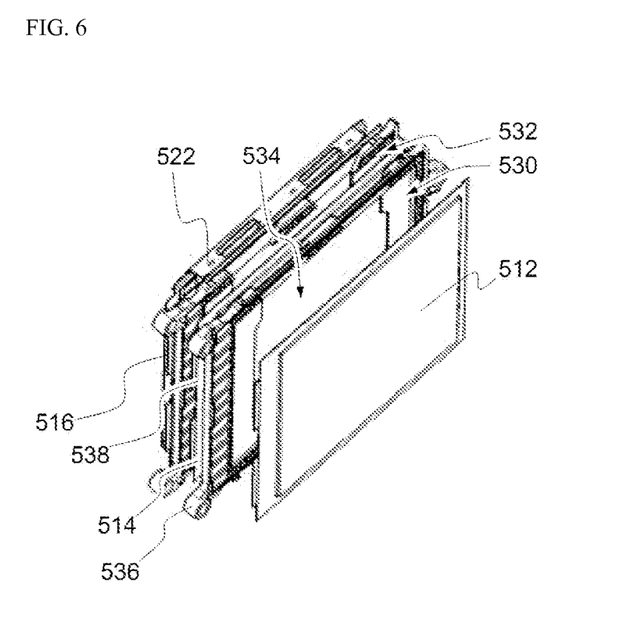
FIG. 6 is an exploded view of a unit module according to another embodiment of the present invention.
Figure 7:
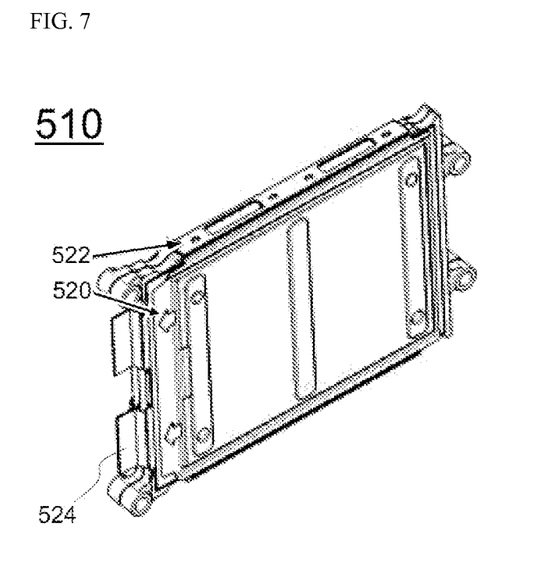
FIG. 7 is a perspective view of the unit module of FIG. 6 when assembled.

FIG. 6 is a schematic exploded view of a unit module according to another embodiment of the present invention and FIG. 7 is a schematic perspective view of the unit module of FIG. 6 when assembled.

Figure 8:
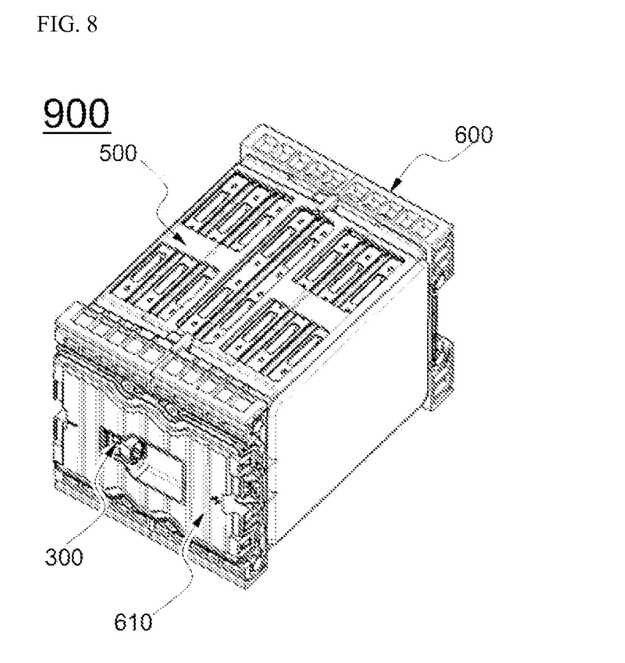
FIG. 8 is a perspective view of the battery module of FIG. 3 with a cover attached to the front of the battery module.
Figure 9:
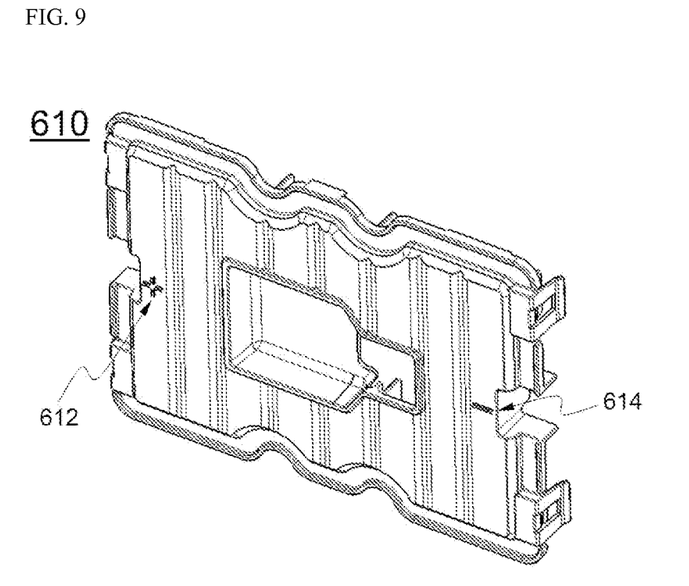
FIG. 9 is a perspective view of the cover of FIG. 8.

FIG. 8 is a schematic perspective view of the battery module of FIG. 3 with a cover attached to the front of the battery module and FIG. 9 is a schematic perspective view of the cover of FIG. 8.

Referring to FIGS. 8 and 9, together with FIGS. 1 to 4, a battery module 900 includes a voltage sensing assembly 300, two unit module stacks 500, cover members 600 attached to four corners of the unit module stacks 500, and a cover 610 attached to the front of the battery module.

Each of the unit module stacks 500 includes four unit modules 510 which are arranged side by side, each of the unit modules being structured such that three battery cells 512, 514, and 516, which are housed within two cell covers 520 and 522, are mounted in two cartridges 530 and 532.

Each of the cartridges 530 has a rectangular structure corresponding to a battery cell such that battery cells can be mounted in the cartridge 530. Each of the cartridges 530 is provided at a central region thereof with a through hole 534 for heat dissipation. Fastening holes 536, through which fastening members (not shown) are inserted to fasten the unit modules 510, are formed in four corners of the cartridge 530.

The cartridge 530 is also provided at the front thereof with a coupling part 538, to which an insulative mounting member 700 for mounting the voltage sensing assembly 300 and the bus bars is fastened in an assembly fashion such that the voltage sensing assembly 300 is securely connected to the bus bars.

The cover 610 has a size corresponding to the front of the battery module 900 and is formed of injection-molded plastic. Marks 612 and 614 indicating the polarities of the cathode external input and output terminal 402 and the anode external input and output terminal 404 are printed on the surface of the cover 610 at opposite lateral sides thereof.

Figure 10:
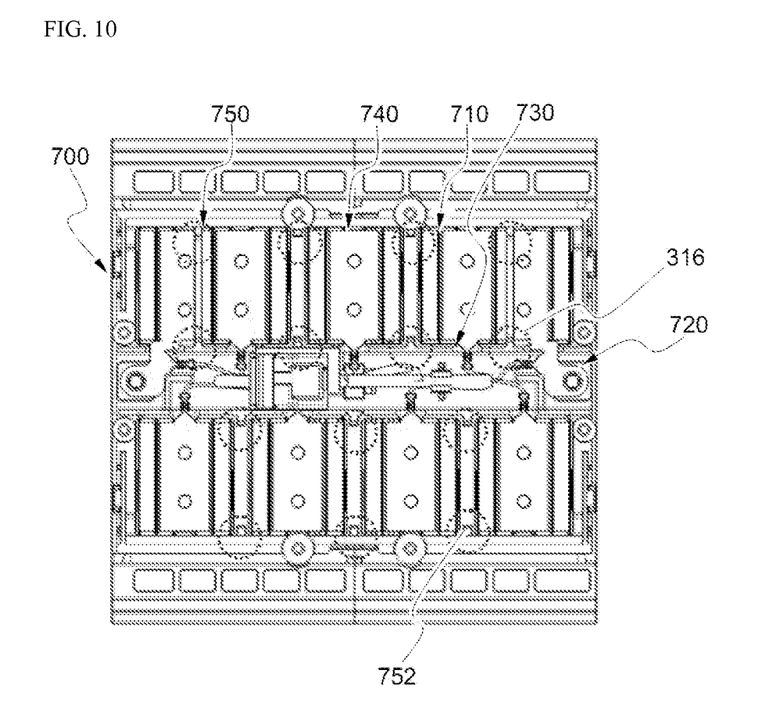
FIG. 10 is a magnified view of a part of the front of the battery module of FIG. 3.
Figure 11:
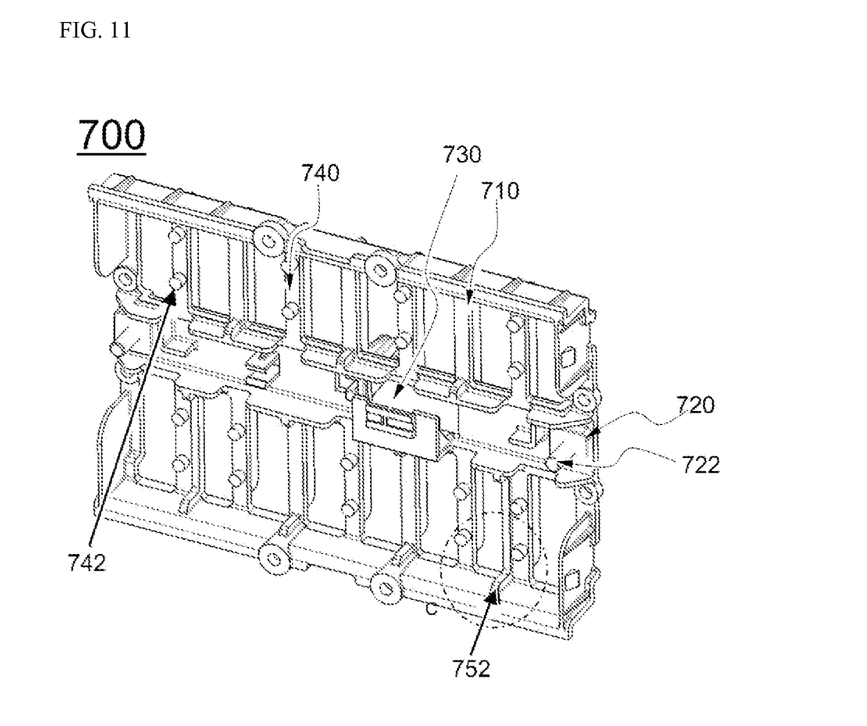
FIG. 11 is a perspective view of the insulative mounting member in the battery module of FIG. 3.

FIG. 10 is a schematic magnified view of a part of the front of the battery module of FIG. 3 and FIG. 11 is a schematic perspective view of the insulative mounting member in the battery module of FIG. 3.

Figure 12:
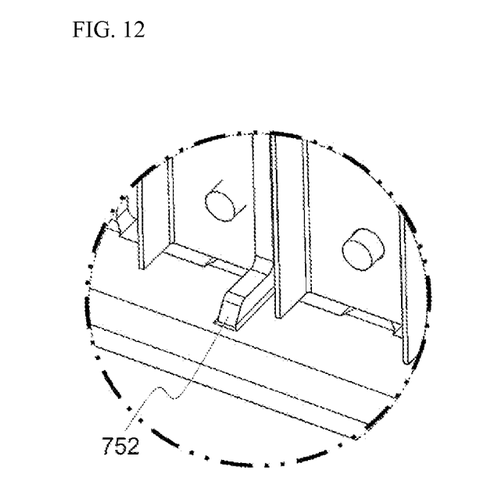
FIG. 12 is a schematic magnified view of a part C of FIG. 11.

FIG. 12 is a schematic magnified view of a part C of FIG. 11.

Referring to FIGS. 10 to 12, together with FIGS. 4 to 7, the insulative mounting member 700 has a rectangular parallelepiped structure having a size corresponding to the front of the unit module stack 500. The insulative mounting member 700 is provided at the rear thereof with cartridge coupling grooves (not shown) into which the front ends of the cartridges are inserted and coupled. The insulative mounting member 700 is also provided at the front thereof with electrode terminal through holes 710, through which the electrode terminal connection parts 524 of the battery cells are introduced from the rear of the insulative mounting member 700 such that the electrode terminal connection parts 524 are exposed.

In addition, location parts 720 for external input and output terminal connection parts are formed on the front of the insulative mounting member 700 at opposite ends thereof to securely mount the external input and output terminal connection parts 348 of the bus bars 340 to the insulative mounting member 700. A block case location part 730 is formed on the front of the insulative mounting member 700 at a central region thereof to securely mount the block case 310 to the insulative mounting member 700.

Bus bar location parts 740, each having a size corresponding to a bus bar 340, are formed on the front of the insulative mounting member 700 to mount the bus bars 340 to the insulative mounting member 700.

A fastening protrusion 722 is formed on each of the location parts 720 for external input and output terminal connection parts. The electrode terminal connection parts 524 of the battery cells, which are exposed forward through the electrode terminal through holes 710, are electrically connected to opposite lateral sides of the bus bars 340 which are mounted in the electrode terminal through holes 710.

Protrusions 742 for fixing the bus bars, which project from the bus bar location parts 740, are coupled to the bus bars 340 through thermal welding and partition walls 750 and 752 are formed on upper and lower end surfaces of the insulative mounting member 700 to prevent current passage through moisture and short circuit through condensation.

Figure 13:
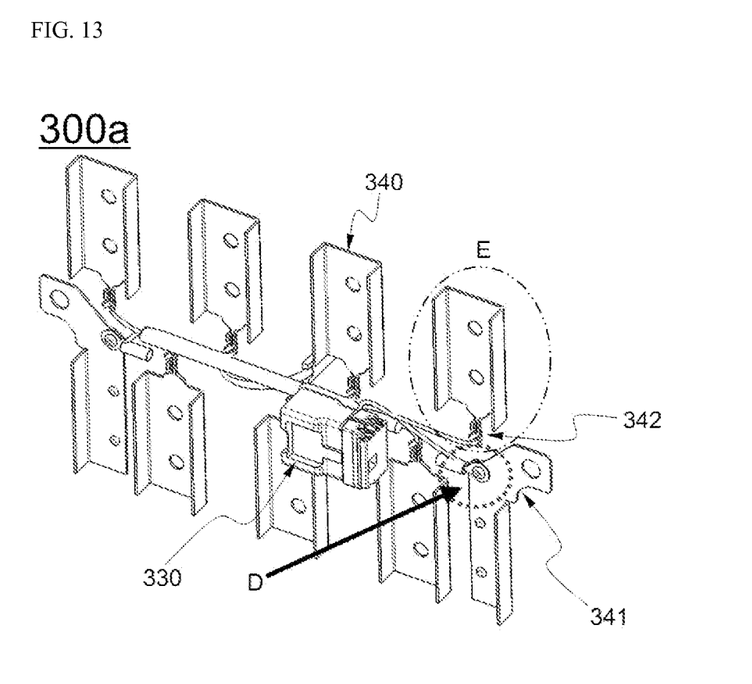
FIG. 13 is a perspective view of a voltage sensing assembly according to another embodiment of the present invention.
Figure 14:
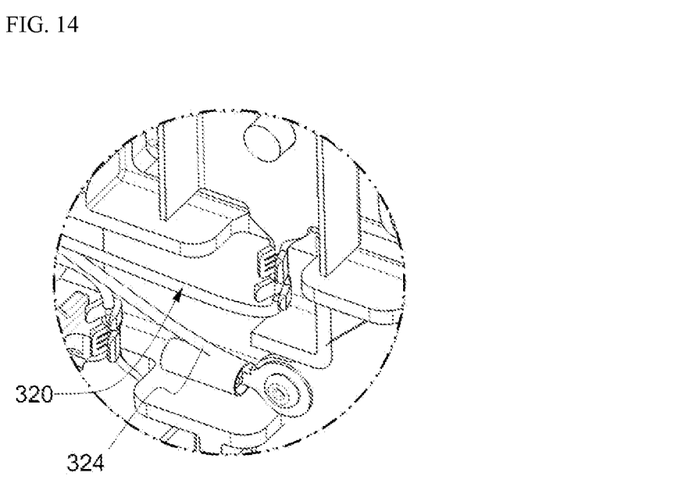
FIG. 14 is a schematic magnified view of a part D of FIG. 13.

FIG. 13 is a schematic perspective view of a voltage sensing assembly according to another embodiment of the present invention and FIG. 14 is a schematic magnified view of a part D of FIG. 13.

Figure 15:
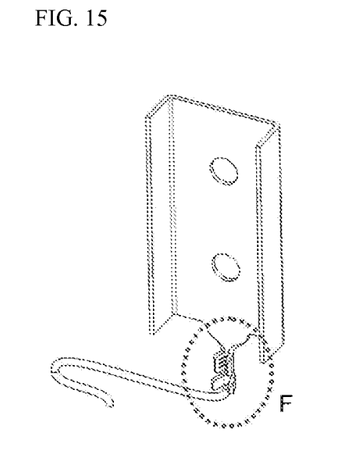
FIG. 15 is a schematic magnified view of a part E of FIG. 13.

FIG. 15 is a schematic magnified view of a part E of FIG. 13.

As shown in FIGS. 13 to 15, a voltage sensing assembly 300a includes bus bars 340 electrically connected to electrode terminal connection parts of battery cells, wires 320 connected respectively to voltage sensing terminals 342, each of which is integrally formed at an upper or lower end of a corresponding one of the bus bars 340, and a connector 330 that transmits detected voltages of the wires 320 to a controller.

The voltage sensing terminals 342 have a clamping structure F, into which the wires 320 are inserted, such that the wires 320 are securely fixed to the voltage sensing terminals 342.

A wire 324 for detecting voltage of an external input and output terminal is coupled to a bus bar 341 connected to the external input and output terminal through a rivet structure D.

Although the present invention has been described above with reference to the drawings which illustrate the embodiments of the present invention, it will be apparent to those skilled in the art that various modifications and variations are possible in light of the above teaching without departing from the scope of the invention.

INDUSTRIAL APPLICABILITY

As is apparent from the above description, a voltage sensing assembly according to the present invention can achieve a reliable sensing structure since wires are directly assembled on bus bars without using additional assembly structures such as connection structures between bus bars and receptacle terminals.

In addition, the voltage sensing assembly according to the present invention is manufactured through a simple assembly method without using a number of members for mechanical coupling and electrical connection. Therefore, it is possible to reduce manufacturing costs of the voltage sensing assembly and also to reliably measure voltage even when strong external impact or vibration is applied to the voltage sensing assembly.

Further, it is possible to greatly improve productivity and maintenance of battery modules since the voltage sensing assembly according to the present invention is formed as a separate assembly.

The invention claimed is:

1. A voltage sensing assembly for sensing voltage of battery cells, each having electrode terminals formed at an upper or lower end thereof, in a state in which the voltage sensing assembly is mounted to a battery module, the voltage sensing assembly comprising:
(a) a block case formed of an electrically insulating material, the block case being mounted, horizontally within a space between electrode terminal connection parts of the battery cells, to the front or rear of the battery module;
(b) wires connected respectively to voltage sensing terminals, each of the voltage sensing terminals being integrally formed at an upper or lower end of a corresponding one of bus bars electrically connected to the electrode terminal connection parts of the battery cells; and
(c) a connector that transmits detected voltages of the wires to a controller,
wherein the block case comprises a fastening member that protrudes forward from the block case to securely fix the wires,
the wires are connected to the voltage sensing terminals of the bus bars in a state in which the wires are mounted to the fastening member of the block case, and
each of the bus bars comprises a plate-shaped body, which is bent perpendicularly at opposite lateral ends thereof such that the plate-shaped body is electrically connected to electrode terminal connection parts of corresponding battery cells, and a voltage sensing terminal formed at an upper or lower end of the plate-shaped body.

2. The voltage sensing assembly according to claim 1, wherein the block case is provided at upper and lower ends thereof with openings at positions corresponding to the voltage sensing terminals of the bus bars such that the voltage sensing terminals are inserted into the openings.

3. The voltage sensing assembly according to claim 1, wherein each of the voltage sensing terminals has a clamping structure into which a wire is inserted.

4. The voltage sensing assembly according to claim 1, wherein each of the wires is wrapped with an insulating tape or is mounted in a tubular insulating member to achieve insulation from the outside.

5. The voltage sensing assembly according to claim 1, wherein the fastening member is clamp-shaped.

6. The voltage sensing assembly according to claim 1, wherein one of the bus bars, which is connected to a cathode or anode external input and output terminal, further comprises an external input and output terminal connection part that extends diagonally downward from one side of a lower end of a plate-shaped body of the one bus bar.

7. The voltage sensing assembly according to claim 6, wherein the external input and output terminal connection part is provided with a fastening hole into which the external input and output terminal can be coupled.

8. The voltage sensing assembly according to claim 1, wherein a voltage sensing terminal of one of the bus bars connected to the cathode or anode external input and output terminal is formed at a lower end of the one bus bar, the lower end thereof being perpendicularly bent forward of the battery module.

9. The voltage sensing assembly according to claim 1, wherein partition walls are formed on upper and lower end surfaces of the block case to prevent current passage through moisture.

10. A battery module comprising:
a voltage sensing assembly according to claim 1;
a unit module stack in which two or more unit modules are arranged side by side, each of the unit modules being structured such that one or more battery cells housed within a cell cover are mounted in a cartridge; and
cover members attached to four corners of the unit module stack.

11. The battery module according to claim 10, wherein each of the cartridges has a rectangular structure corresponding to a battery cell such that the battery cell can be mounted in the cartridge and is provided at a central region thereof with a through hole for heat dissipation, fastening holes, through which fastening members to fix the unit module stack are inserted, are formed in four corners of each of the cartridges, and a coupling part, to which an insulative mounting member for mounting the voltage sensing assembly and bus bars is fastened in an assembly fashion such that the voltage sensing assembly is securely connected to the bus bars, is formed at the front of each of the cartridges.

12. The battery module according to claim 11, wherein the insulative mounting member has a rectangular parallelepiped structure having a size corresponding to the front of the unit module stack and is provided at the rear thereof with cartridge coupling grooves, into which front ends of the cartridges can be inserted and coupled, and at the front thereof with electrode terminal through holes, through which electrode terminal connection parts of the battery cells are introduced from the rear of the insulative mounting member such that the electrode terminal connection parts are exposed.

13. The battery module according to claim 12, wherein the insulative mounting member is provided at opposite ends of the front thereof with external input and output terminal connection part location parts to securely mount external input and output terminal connection parts of the bus bars to the insulative mounting member, at a central region of the front thereof with a block case location part to securely mount the block case to the insulative mounting member, and on the front thereof with bus bar location parts, each having a size corresponding to each of the bus bars, to mount the bus bars to the insulative mounting member.

14. The battery module according to claim 13, wherein a fastening protrusion is formed on each of the external input and output terminal connection part location parts.

15. The battery module according to claim 13, wherein the electrode terminal connection parts of the battery cells, which are exposed forward through the electrode terminal through holes, are electrically connected to opposite lateral sides of the bus bars, the opposite lateral sides being mounted in the electrode terminal through holes.

16. The battery module according to claim 13, wherein the bus bars are coupled to the bus bar location parts through thermal welding.

17. The battery module according to claim 12, wherein partition walls are formed on upper and lower end surfaces of the insulative mounting member to prevent current passage through moisture.

18. The battery module according to claim 10, wherein each of the battery cells is a pouch-shaped battery cell including an electrode assembly mounted in a case formed of a laminate sheet comprising a resin layer and a metal layer.

19. A high-power, large-capacity battery pack manufactured using a battery module according to claim 10 as a unit body.

20. The battery pack according to claim 19, wherein the battery pack is used as a power source for electric vehicles, hybrid electric vehicles, plug-in hybrid electric vehicles, or power storage devices.

21. A voltage sensing assembly for sensing voltage of battery cells, each having electrode terminals formed at an upper or lower end thereof, in a state in which the voltage sensing assembly is mounted to a battery module, the voltage sensing assembly comprising:

(a) bus bars electrically connected to electrode terminal connection parts of the battery cells;

(b) wires connected respectively to voltage sensing terminals, each of the voltage sensing terminals being integrally formed at an upper or lower end of a corresponding one of the bus bars; and (c) a connector that transmits detected voltages of the wires to a controller, wherein each of the voltage sensing terminals has a clamping structure into which a wire is inserted, and each of the bus bars comprises a plate-shaped body, which is bent perpendicularly at opposite lateral ends thereof such that the plate-shaped body is electrically connected to electrode terminal connection parts of corresponding battery cells, and a voltage sensing terminal formed at an upper or lower end of the plate-shaped body.

\* \* \* \* \*